US009890255B2

(12) United States Patent
Song et al.

(10) Patent No.: US 9,890,255 B2
(45) Date of Patent: Feb. 13, 2018

(54) MODIFIED HYDROGENATED POLYSILOXAZANE, COMPOSITION COMPRISING SAME FOR FORMING SILICA-BASED INSULATION LAYER, METHOD FOR PREPARING COMPOSITION FOR FORMING

(71) Applicant: CHEIL INDUSTRIES INC., Gumi-si, Gyeongsangbuk-do (KR)

(72) Inventors: Hyun-Ji Song, Suwon-si (KR); Eun-Su Park, Suwon-si (KR); Sang-Hak Lim, Suwon-si (KR); Taek-Soo Kwak, Suwon-si (KR); Go-Un Kim, Suwon-si (KR); Mi-Young Kim, Suwon-si (KR); Bo-Sun Kim, Suwon-si (KR); Bong-Hwan Kim, Suwon-si (KR); Yoong-Hee Na, Suwon-si (KR); Jin-Hee Bae, Suwon-si (KR); Jin-Woo Seo, Suwon-si (KR); Hui-Chan Yun, Suwon-si (KR); Han-Song Lee, Suwon-si (KR); Jong-Dae Jeon, Suwon-si (KR); Kwen-Woo Han, Suwon-si (KR); Seung-Hee Hong, Suwon-si (KR); Byeong-Gyu Hwang, Suwon-si (KR)

(73) Assignee: CHEIL INDUSTRIES, INC., Gumi-Si, Gyeongsangbuk-Do (KR)

( * ) Notice: Subject to any disclaimer, the term of this patent is extended or adjusted under 35 U.S.C. 154(b) by 420 days.

(21) Appl. No.: 14/429,512

(22) PCT Filed: Jul. 15, 2013

(86) PCT No.: PCT/KR2013/006291
§ 371 (c)(1),
(2) Date: Mar. 19, 2015

(87) PCT Pub. No.: WO2014/104510
PCT Pub. Date: Jul. 3, 2014

(65) Prior Publication Data
US 2015/0225508 A1 Aug. 13, 2015

(30) Foreign Application Priority Data

Dec. 31, 2012 (KR) .................. 10-2012-0158166

(51) Int. Cl.
| | | |
|---|---|---|
| *C08G 77/54* | (2006.01) |
| *H01B 3/46* | (2006.01) |
| *C09D 183/16* | (2006.01) |
| *H01B 3/30* | (2006.01) |
| *H01B 3/02* | (2006.01) |
| *H01L 21/02* | (2006.01) |
| *C09D 183/02* | (2006.01) |
| *C09D 183/14* | (2006.01) |
| *C08G 77/60* | (2006.01) |
| *C08G 77/62* | (2006.01) |

(52) U.S. Cl.
CPC .......... *C08G 77/54* (2013.01); *C09D 183/02* (2013.01); *C09D 183/14* (2013.01); *C09D 183/16* (2013.01); *H01B 3/02* (2013.01); *H01B 3/303* (2013.01); *H01B 3/46* (2013.01); *H01L 21/0229* (2013.01); *H01L 21/02164* (2013.01); *H01L 21/02211* (2013.01); *H01L 21/02222* (2013.01); *H01L 21/02255* (2013.01); *H01L 21/02326* (2013.01); *C08G 77/60* (2013.01); *C08G 77/62* (2013.01)

(58) Field of Classification Search
CPC ............................. C08G 77/62; C07F 7/0821
See application file for complete search history.

(56) References Cited

U.S. PATENT DOCUMENTS

| 4,869,858 | A | * | 9/1989 | Funayama | ............. | C08G 77/54 |
|---|---|---|---|---|---|---|
| | | | | | | 264/103 |
| 5,145,812 | A | | 9/1992 | Mikiro et al. | | |
| 6,562,465 | B1 | | 5/2003 | Nakashima et al. | | |
| 2008/0305611 | A1 | | 12/2008 | Hirota | | |
| 2009/0061569 | A1 | | 5/2009 | Hirakata et al. | | |
| 2010/0184268 | A1 | | 7/2010 | Hirota | | |

FOREIGN PATENT DOCUMENTS

| CN | 102569060 A | 7/2012 |
|---|---|---|
| CN | 102585516 A | 7/2012 |
| CN | 102874813 | 1/2013 |
| EP | 2-071-616 A1 | 6/2009 |
| JP | 06-018885 B2 | 3/1994 |
| JP | 10-046108 A | 2/1998 |
| KR | 10-1989-0010043 A | 8/1989 |

(Continued)

OTHER PUBLICATIONS

Chinese Search Report dated Apr. 8, 2016.
Search Report dated Dec. 1, 2014 in corresponding Taiwanese Patent Application No. 1020126041.
Chinese Search Report dated Nov. 3, 2016 for corresponding Chinese Patent Application No. 201380049625.0.

*Primary Examiner* — Kuo-Liang Peng

(74) *Attorney, Agent, or Firm* — Lee & Morse, P.C.

(57) ABSTRACT

Disclosed is modified hydrogenated polysiloxazane prepared by reacting hydrogenated polysiloxazane with a silane compound selected from polysilane, polycyclosilane, and a silane oligomer. The modified hydrogenated polysiloxazane has a small mole ratio of nitrogen atoms relative to silicon atoms and may remarkably deteriorate a film shrinkage ratio when included in a composition for forming a silica-based insulation layer to form a silica-based insulation layer.

19 Claims, No Drawings

(56) References Cited

FOREIGN PATENT DOCUMENTS

| | | |
|---|---|---|
| KR | 10-2006-0066137 A | 6/2006 |
| KR | 10-0600630 B1 | 7/2006 |
| KR | 10-2009-0060433 A | 6/2009 |
| KR | 10-2011-0012574 A | 2/2011 |
| KR | 10-2011-0062158 A | 6/2011 |
| KR | 10-2012-0080383 A | 7/2012 |
| TW | 1221159 | 9/2004 |
| TW | 201233741 A | 8/2012 |
| WO | WO 2008/029834 A1 | 3/2008 |
| WO | WO 2011/053551 A1 | 5/2011 |

\* cited by examiner

MODIFIED HYDROGENATED POLYSILOXAZANE, COMPOSITION COMPRISING SAME FOR FORMING SILICA-BASED INSULATION LAYER, METHOD FOR PREPARING COMPOSITION FOR FORMING

BACKGROUND OF THE INVENTION (a) Field of the Invention

This disclosure relates to modified hydrogenated polysiloxazane, a composition for forming a silica-based insulation layer including the same and a method for manufacturing the same, and a silica-based insulation layer using the same, and a method for manufacturing the same.

(b) Description of the Related Art

As semiconductor technology is increasingly developed, there is continuous research on forming highly-integrated and faster semiconductor memory cells that have improved performance and integrate smaller semiconductor chips. Among these semiconductor memory cells, e.g., DRAM (dynamic random access memory) may be used.

The DRAM is capable of freely inputting and outputting information, and may realize large capacity. The DRAM may include, e.g., a plurality of unit cells including one MOS transistor (MOS transistor) and one capacitor. The capacitor may include two electrodes and a dielectric layer disposed therebetween. The capacitor may have various capacities depending on, e.g., a dielectric constant, a thickness of the dielectric layer, an area of the electrodes, and the like.

As a size of a semiconductor chip is reduced, the size of the capacitor therein may also be reduced. However, the smaller capacitor needs sufficient storage capacity. The capacitor may accomplish bigger capacity by, e.g., increasing the vertical area instead of decreasing the horizontal area to increase overall active area. When a capacitor is formed in this way, a silica-based layer manufactured from a composition for forming silica-based layer may be used to fill a mold and a gap thereon and effectively form an electrode being relatively high compared with small horizontal area.

SUMMARY OF THE INVENTION

One embodiment of the present invention provides a novel modified hydrogenated polysiloxazane that shows low shrinkage during conversion into a silica layer through wet heating.

Another embodiment of the present invention provides a composition for forming a silica-based insulation layer including the modified hydrogenated polysiloxazane that shows low shrinkage during conversion into a silica film through wet heating.

Yet another embodiment of the present invention provides a method for preparing a composition for forming a silica-based insulation layer including the modified hydrogenated polysiloxazane that shows low shrinkage during conversion into a silica film through wet heating.

Still another embodiment of the present invention provides a silica-based insulation layer that shows low shrinkage during conversion into a silica film through wet heating.

Further embodiment of the present invention provides a silica-based insulation layer that shows low shrinkage during conversion into a silica film through wet heating.

According to one embodiment of the present invention, provided is modified hydrogenated polysiloxazane prepared by reacting hydrogenated polysiloxazane with a silane compound selected from polysilane, polycyclosilane, and a silane oligomer.

The modified hydrogenated polysiloxazane may have an atom number ratio (N/Si) of a nitrogen atom relative to a silicon atom of less than or equal to 0.95.

The modified hydrogenated polysiloxazane may include structural units represented by the following Chemical Formulae 1 to 3.

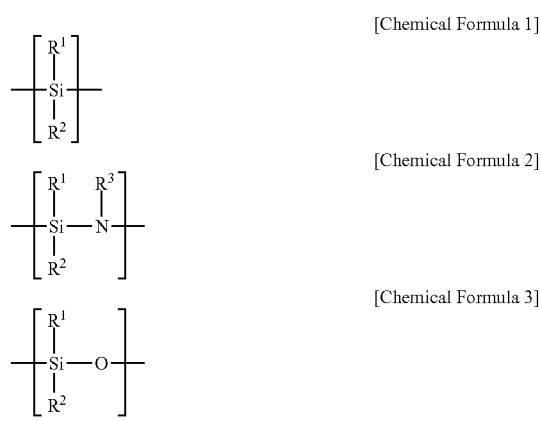

[Chemical Formula 1]

[Chemical Formula 2]

[Chemical Formula 3]

In the above Chemical Formulae 1 to 3, $R^1$ and $R^2$ are each independently selected from H, $SiH_3$, and $NH_2$, and $R^3$ is H or $SiH_3$.

The modified hydrogenated polysiloxazane may have 0.2 to 3 wt % of an oxygen content based on the total weight of the modified hydrogenated polysiloxazane.

The modified hydrogenated polysiloxazane may have a weight average molecular weight of 1,000 to 30,000.

According to another embodiment of the present invention, provided is a composition for forming a silica-based insulation layer including the modified hydrogenated polysiloxazane that is prepared by reacting hydrogenated polysiloxazane with a silane compound selected from polysilane, polycyclosilane, and a silane oligomer.

The modified hydrogenated polysiloxazane may have an atom number ratio (N/Si) of a nitrogen atom relative to a silicon atom of less than or equal to 0.95.

The modified hydrogenated polysiloxazane may include structural units represented by the following Chemical Formulae 1 to 3.

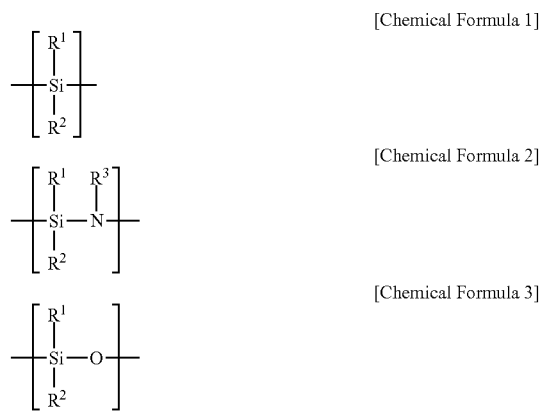

[Chemical Formula 1]

[Chemical Formula 2]

[Chemical Formula 3]

In the above Chemical Formulae 1 to 3, $R^1$ and $R^2$ are each independently selected from H, $SiH_3$, and $NH_2$, and $R^3$ is H or $SiH_3$.

The modified hydrogenated polysiloxazane may have a weight average molecular weight of 1,000 to 30,000.

The modified hydrogenated polysiloxazane may be included in an amount of 0.1 to 50 wt % based on the composition for forming a silica-based insulation layer.

According to yet another embodiment of the present invention, provided is a method of preparing a composition for forming a silica-based insulation layer that includes reacting hydrogenated polysiloxazane with a silane compound in a solvent while heating, or adding a halosilane compound and a silane compound to a mixture of pyridine and water and performing coammonolysis to synthesize modified hydrogenated polysiloxazane and then to prepare a modified hydrogenated polysiloxazane solution, wherein the silane compound is selected from polysilane, polycyclosilane, and a silane oligomer.

The halosilane compound may be selected from dichlorosilane, trichlorosilane, tetrachlorosilane, and a mixture thereof.

In one embodiment, the silane compound may have preferably a structure represented by the following Chemical Formula 4.

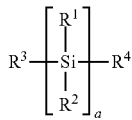

[Chemical Formula 4]

In the above Chemical Formula 4, $R^1$ and $R^2$ are each independently selected from H, $SiH_3$, $NH_2$, Cl, Br, and I, $R^3$ and $R^4$ are each independently selected from H, $SiH_3$, $NH_2$, Cl, Br, and I, or are fused to each other to provide a ring, and a is an integer ranging from 1 to 30.

In one embodiment, the silane compound may be preferably cyclopentasilane.

In one embodiment of the present invention, the method of preparing the composition for forming a silica-based insulation layer may further include substituting a solvent of the modified hydrogenated polysiloxazane solution with a nonpolar solvent.

The nonpolar solvent may be xylene or di-n-butylether.

According to still another embodiment of the present invention, a silica-based insulation layer manufactured using the composition for forming a silica-based insulation layer is provided.

According to further embodiment of the present invention, provided is a method of manufacturing a silica-based insulation layer that includes applying the above-described composition for forming a silica-based insulation layer on a substrate; soft-baking the substrate applied with the composition for forming a silica-based insulation layer at a temperature of greater than or equal to 50° C. and less than or equal to 200° C.; and heating the soft-baked substrate at a temperature of greater than or equal to 200° C. and less than or equal to 1,000° C., under an oxygen atmosphere or an atmosphere including water vapor of greater than or equal to 0.1 kPa.

Other embodiments of the present invention are included in the following detailed description.

The modified hydrogenated polysiloxazane has a small molar content of a relative nitrogen atom relative to a silicon atom and thus when it is applied to the composition for forming a silica-based insulation layer to form a silica-based insulation layer, a film shrinkage may be remarkably reduced.

DETAILED DESCRIPTION

Exemplary embodiments of the present invention will hereinafter be described in detail. However, these embodiments are only exemplary and do not limit the present invention.

A modified hydrogenated polysiloxazane according to one embodiment is prepared by reacting hydrogenated polysiloxazane with a silane compound selected from polysilane, polycyclosilane, and a silane oligomer.

In general, when hydrogenated polysiloxazane having a hydrogenated silazane unit and a hydrogenated siloxane unit at 1:1 is converted into silica under water vapor, a reaction such as the following Reaction Scheme 1 carries out.

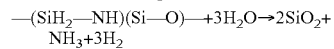

[Reaction Scheme 1]

When the hydrogenated polysiloxazane is converted into silica, $SiO_2$ is generated with simultaneous generation of $NH_3$, which causes a weight loss in the reaction. Accordingly, if a generation amount of $NH_3$ is reduced, shrinkage at heating may be reduced.

As shown in Reaction Scheme 1, since $NH_3$ is produced from nitrogen included in hydrogenated polysiloxazane, hydrogenated polysiloxazane reacts hydrogenated polysiloxazane with a silane compound including no Si—C bond and is modified by using a modification method of decreasing the molar content of nitrogen atoms in hydrogenated polysiloxazane relative to the molar content of silicon atoms, and thus, the modified hydrogenated polysiloxazane includes a relatively small molar content of nitrogen atoms relative to a molar content of silicon and may decrease a film shrinkage ratio during manufacture of a silica-based insulation layer.

Specifically, the modified hydrogenated polysiloxazane may have an atom number ratio (N/Si) of a nitrogen atom relative to a silicon atom of less than or equal to 0.95, and specifically 0.85 to 0.95. A film shrinkage ratio during conversion into silica is affected by a heating temperature and the like, but a mole ratio (N/Si) of a nitrogen atom relative to a silicon atom of the modified hydrogenated polysiloxazane is less than or equal to 0.95, film shrinkage of silica may be remarkably reduced.

The modified hydrogenated polysiloxazane may have 0.2 to 3 wt % of an oxygen content based on the total weight of the modified hydrogenated polysiloxazane. When the oxygen content is within the range, a silicon-oxygen-silicon (Si—O—Si) bond sufficiently buffers a stress in the structure of the modified hydrogenated polysiloxazane and thus, may prevent shrinkage during heat treatment and resultantly, generation of a crack in a charge pattern.

The modified hydrogenated polysiloxazane may include structural units represented by the following Chemical Formulae 1 to 3.

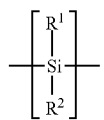

[Chemical Formula 1]

-continued

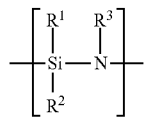
[Chemical Formula 2]

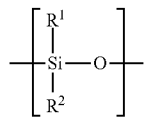
[Chemical Formula 3]

In the above Chemical Formulae 1 to 3, $R^1$ and $R^2$ are each independently selected from H, $SiH_3$, and $NH_2$, and $R^3$ is H or $SiH_3$.

The modified hydrogenated polysiloxazane may have a weight average molecular weight of 1,000 to 30,000. When the modified hydrogenated polysiloxazane has an extremely small weight average molecular weight, the modified hydrogenated polysiloxazane has a low polymer viscosity and becomes a liquid and thus, hardly forms a film when coated on a substrate, or components having low molecular weight therein are evaporated during the heat-treatment and conversion into silica, while when the weight average molecular weight is extremely large, the modified hydrogenated polysiloxazane may be easily gelized or hardly gap-fill a narrow trench when coated on a substrate having protrusions and depressions (凹凸). When the modified hydrogenated polysiloxazane has a weight average molecular weight within the range, a silica film may not be gelized but uniformly formed. In this regard, the modified hydrogenated polysiloxazane may have a weight average molecular weight (Mw) of 1500 to 7000 within the range.

A composition for forming a silica-based insulation layer according to one embodiment of the present invention includes the modified hydrogenated polysiloxazane.

The modified hydrogenated polysiloxazane is the same as describe above.

The modified hydrogenated polysiloxazane may be included in an amount of 0.1 to 50 wt % based on the composition for forming a silica-based insulation layer. When included within the range, an appropriate viscosity may be maintained. In addition, when a gap is filled with the composition for forming a silica-based insulation layer including the modified hydrogenated polysiloxazane, a silica-based insulation layer may be formed in smooth and uniform without voids.

The composition for forming a silica-based insulation layer may further include a thermal acid generator (TAG).

The thermal acid generator may be an additive to improve developability of the modified hydrogenated polysiloxazane, and the modified hydrogenated polysiloxazane may be developed at a relatively low temperature.

The thermal acid generator may include any compound without particular limit, if it generates acid ($H^+$) by heat. In particular, it may include a compound activated at 90° C. or higher and generating sufficient acid and also, having low volatility. Such a thermal acid generator may be, for example selected from nitrobenzyl tosylate, nitrobenzyl benzenesulfonate, phenol sulfonate, and a combination thereof.

The thermal acid generator may be included in an amount of 0.01 to 25 wt % based on the total amount of the composition for forming a silica-based insulation layer. Within the range, the modified hydrogenated polysiloxazane may be developed at a low temperature and simultaneously, have improved coating properties.

The composition for forming a silica-based insulation layer may further include a surfactant.

The surfactant is not particularly limited and includes, for example a nonion-based surfactant of polyoxyethylene alkyl ethers such as polyoxyethylene lauryl ether, polyoxyethylene stearyl ether, polyoxyethylene cetyl ether, polyoxyethylene oleyl ether, and the like; polyoxyethylene alkylallyl ethers such as polyoxyethylene nonylphenolether, and the like; polyoxyethylene.polyoxypropylene block copolymers; polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactant such as a organosiloxane polymer KP341 (Shin-Etsu Chemical Co., Ltd.), and the like.

The surfactant may be included in an amount of 0.001 wt % to 10 wt % based on the total amount of the composition for forming a silica-based insulation layer. Within the range, dispersion of a solution and simultaneously, uniform thickness of a layer and filling properties are improved.

The composition for forming a silica-based insulation layer may be a solution where the modified hydrogenated polysiloxazane and the other components are dissolved in a solvent.

The solvent may be not specifically limited as long as capable of dissolving the components, and may include, for example alcohols such as methanol, ethanol and the like; ethers such as dichloroethyl ether, di-n-butyl ether, diisoamyl ether, methylphenyl ether, tetrahydrofuran and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy acetic acid alkyl esters such as methyl oxy acetate, ethyl oxy acetate, butyl oxy acetate, and the like; alkoxy acetic acid alkyl esters such as methyl methoxy acetate, ethyl methoxy acetate, butyl methoxy acetate, methyl ethoxy acetate, ethyl ethoxy acetate, and the like; alkyl 3-oxy propionate esters such as methyl 3-oxy propionate, ethyl 3-oxy propionate, and the like; alkyl 3-alkoxy propionate esters such as 3-methoxy methyl propionate, 3-methoxy ethyl propionate, 3-ethoxy ethyl propionate, 3-ethoxy methyl propionate and the like; alkyl 2-oxy propionate esters such as 2-oxy methyl propionate, 2-oxy ethyl propionate, 2-oxy propionic acid propyl and the like; 2-methoxy methyl propionate, 2-methoxy ethyl propionate, 2-ethoxy ethyl propionate, 2-ethoxy methyl propionate and the like; 2-oxy-2-methyl propionate ester such as 2-oxy-2-methyl methyl propionate, 2-oxy-2-methyl ethyl propionate and the like; monooxy monocarboxylic acid alkyl ester of alkyl 2-alkoxy-2-methyl propionate such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-methyl hydroxy-3-methyl butanoate, and the like; ketonate esters such as ethyl pyruvate, and the like; and the like. In addition, a solvent having a high boiling point such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetnylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like may be added. Among them, at least one selected from diethyleneglycolmonomethylether, diethyleneglycoldiethylether, ethyl-3-ethoxy propionate, methyl-3-methoxy propionate, cyclopentanone, cyclohexanone, propyleneglycolmonomethyl ether acetate, propyleneglycoldimethyletheracetate, 1-methoxy-2-propanol, ethyl lactate, cyclopentanone, and ethyl hydroxyacetate may be used.

Particularly, in one embodiment, the solvent may preferably at least one solvent having a high boiling point. In this case, the solvent may prevent generation of a void inside a gap when the gap is filled and also, may be slowly volatilized and thus, increase film flatness.

The solvent may be included in a balance amount based on the total weight of a composition for forming a silica-based insulation layer.

The composition for forming a silica-based insulation layer including the modified hydrogenated polysiloxazane according to one embodiment of the present invention may be prepared by reacting hydrogenated polysiloxazane with a silane compound in a solvent while heating (a first method), or adding a halosilane compound and a silane compound to a mixture of pyridine and water and performing coammonolysis (a second method).

According to the first method, modified hydrogenated polysiloxazane is prepared through a dehydration bond between an N—H group of the hydrogenated polysiloxazane and a Si—H group of polysilane when hydrogenated polysiloxazane is heated and reacted with a silane compound.

Herein, the hydrogenated polysiloxazane may be obtained in a conventional manufacturing method and specifically, by combining more than one halosilane compound and coammonolysizing them.

Specifically, the halosilane compound may include dichlorosilane, trichlorosilane, tetrachlorosilane, and a mixture thereof.

Since the hydrogenated polysiloxazane has a higher molecular weight due to addition and cross-linking of polysilane during reaction with the polysilane, hydrogenated polysiloxazane having a weight average molecular weight ranging from 500 to 15,000 may be used, hereinafter.

The silane compound may be selected from polysilane, polycyclosilane, and silane oligomer and have a linear, branched, cyclic, or three dimensional cross-linking structure.

In one embodiment, the silane compound may have preferably a structure represented by the following Chemical Formula 4.

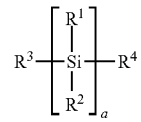

[Chemical Formula 4]

In the above Chemical Formula 4, $R^1$ and $R^2$ are each independently selected from H, $SiH_3$, $NH_2$, Cl, Br, and I, $R^3$ and $R^4$ are each independently selected from H, $SiH_3$, $NH_2$, Cl, Br, and I, or are fused to each other to provide a ring, and a is an integer ranging from 1 to 30.

In one embodiment, the silane compound may be preferably cyclopentasilane.

The silane compound may be used in an amount of 5 to 40 parts by weight based on 100 parts by weight of the hydrogenated polysiloxazane. When the silane compound is used within the range, modified hydrogenated polysiloxazane having low shrinkage during its conversion into a silica film through wet heating may be prepared.

The nonpolar solvent may be an aromatic hydrocarbon-based organic solvent such as xylene or di-n-butylether, and a basic material such as pyridine and the like may be added to increase a reaction rate. In addition, when moisture, alcohols, or the like is present in the solvent, hydrolysis or addition reaction of an alkoxy group occurs and may have a negative influence on modification of hydrogenated polysiloxazane, and accordingly, the solvent needs to be sufficiently dehydrated and purified before the use.

The reaction may be performed at a temperature ranging from greater than or equal to about 0° C. to less than or equal to about 200° C. and greater than or equal to about 40° C. to less than or equal to about 120° C. in terms of a reaction rate and controlling property.

The hydrogenated polysiloxazane may have an increased molecular weight due to an addition reaction and a cross-linking reaction with a silane compound selected from polysilane, polycyclosilane, and a silane oligomer before and after the modification reaction. In addition, since the reaction occurs due to a dehydration bond between an N—H group of hydrogenated polysiloxazane and a Si—H group of polysilane, a hydrogen gas and the like are produced and increase a pressure. Accordingly, the pressure increase during the reaction needs to be controlled.

According to the second method of modifying hydrogenated polysiloxazane, modified hydrogenated polysiloxazane may be prepared by adding a halosilane compound and a silane compound to a mixture of pyridine and water and coammonolysizing the mixture while ammonia is injected thereinto.

The halosilane compound and the silane compound may be the same as illustrated in the first method.

The modified hydrogenated polysiloxazane prepared in the first or second method is obtained as a solid in a solution and thus, additionally filtered and separated, or the solution including the modified hydrogenated polysiloxazane solid itself may be used.

The method of preparing the composition for forming a silica-based insulation layer including the modified hydrogenated polysiloxazane according to one embodiment of the present invention may further include substituting a solvent, for example, pyridine of the modified hydrogenated polysiloxazane solution with a nonpolar solvent The nonpolar solvent may be di-n-butylether, xylene, and the like.

The substitution of the solvent may be performed in a common method and specifically, by adding a dry nonpolar solvent such as dry di-n-butylether, dry xylene, or the like to the solution including the modified hydrogenated polysiloxazane and evaporating pyridine with a rotary evaporator.

A silica-based insulation layer according to one embodiment of the present invention may be manufactured using the composition for forming a silica-based insulation layer.

The silica-based insulation layer may be formed in a common method without a particular limit.

Specifically, a method of manufacturing a silica-based insulation layer may include applying the above-described composition for forming a silica-based insulation layer on a device substrate such as a semiconductor, a liquid crystal and the like; soft-baking the substrate applied with the composition for forming a silica-based insulation layer at a temperature of greater than or equal to about 50° C. and less than or equal to 200° C.; and heating the soft-baked substrate at a temperature of greater than or equal to 200° C. and less than or equal to 1,000° C., under an oxygen atmosphere or an atmosphere including water vapor of greater than or equal to 0.1 kPa.

The coating on the substrate may include a spin-coat method, a slit-coat method, and the like with no particular limit.

The soft-baking process may be performed at temperature ranging from 50° C. to 200° C. for 5 seconds to 10 minutes to remove a solvent included in the modified hydrogenated polysiloxazane thin film. When the baking temperature is extremely low, the solvent may be insufficiently removed, while when the baking temperature is extremely high, an oxidation reaction occurs and may hardly be controlled during a following heat treatment. Accordingly, the baking may be performed within the temperature range. In addition, when the reaction time is extremely short, the reaction is difficult to control, while when the reaction time is extremely long, the reaction is not practical, since an oxidation reaction occurs, or it takes too long to process when too many substrates are treated. Accordingly, the baking may be performed within the time range.

Furthermore, the soft-baking may be performed under any atmosphere including nitrogen, oxygen, or water vapor.

The heating is a process of converting a modified hydrogenated polysiloxazane thin film into a silica thin film and may be performed at a temperature ranging from 200° C. to 1,000° C. for 1 minute to 3 hours. When the reaction temperature is extremely low, modified hydrogenated polysiloxazane may be insufficiently converted into silica, while when the reaction temperature is extremely high, oxidation damage and the like may be generated. Accordingly, the reaction may be performed within the temperature range. In addition, when the heating time is extremely short, a temperature and an atmosphere gas in a cure furnace and the like are difficult to control, while when the heating time is extremely long, oxidation damage on a substrate and the like may be done, and furthermore, when many substrates are treated, the heating process becomes unpractical due to a lengthened time. Accordingly, the heating may be performed within the time range. In addition, the heating process may include a water vapor having a partial water vapor pressure ranging from 0.1 kPa to 20 kPa.

Furthermore, the atmosphere for the heating process may include either one of oxygen and water vapor and may be diluted with an inert gas such as nitrogen, argon gas, or the like.

The reason is that oxidation of modified hydrogenated polysiloxazane essentially needs gas for oxidation, because only the inert gas may not convert hydrogenated polysiloxazane into silica.

The silica-based insulation layer includes modified hydrogenated polysiloxazane having a low N/Si ratio and remarkably deteriorates a film shrinkage rate.

The following examples illustrate the present invention in more detail. However, it is understood that the present invention is not limited by these examples.

Comparative Example 1

A 2 L reactor equipped with an agitator and a thermometer was internally substituted with dry nitrogen After injecting 2.0 g of pure water into 1,500 g of the dry pyridine and sufficiently mixing them, the reactor was filled with the mixture and kept warm at 5° C. Subsequently, 100 g of dichlorosilane was slowly injected into the reactor over one hour, and 70 g of ammonia was slowly injected thereinto over 3 hours while the reactor was agitated. After injecting dry nitrogen into the reactor for 30 minutes, ammonia remaining in the reactor was removed, a white slurry-phased product obtained as a resultant was filtered under a dry nitrogen atmosphere with a 1 μm-sized TEFLON (tetrafluoroethylene) filter. Then, 1,000 g of dry di-n-butylether was added to 1,000 g of the filtered solution, a rotary evaporator was used to substitute the solvent therein from pyridine to di-n-butylether and simultaneously adjusting its solid concentration into 20 wt %, and a TEFLON (tetrafluoroethylene) filterer having a pore size of 0.03 μm was used to filter the resultant, obtaining hydrogenated polysiloxazane.

The weight average molecular weight of the hydrogenated polysiloxazane was 2,000, and N/Si of the hydrogenated polysiloxazane was 0.98.

In addition, the hydrogenated polysiloxazane was coated on a silicon wafer at a speed of 1,500 rpm for 20 seconds with a spin coater, dried on a hot plate at 100° C. for 5 minutes, and heated at 750° C. for one hour under an oxygen atmosphere including a partial water vapor pressure of 5 kPa.

A film thickness shrinkage rate before and after the heating was 22.5%.

Comparative Example 2

A 2 L reactor equipped with an agitator and a thermometer was internally substituted with dry nitrogen. Subsequently, after injecting 2.0 g of pure water into 1,500 g of the dry pyridine, sufficiently mixing them, and injecting the mixture into the reactor, the reactor was kept warm at 20° C. Then, 100 g of dichlorosilane was slowly into the reactor over one hour, and 70 g of ammonia was slowly injected thereinto over 3 hours, while the reactor was agitated. Then, dry nitrogen was injected into the reactor for 30 minutes to remove ammonia remaining in the reactor, and a white slurry-phased product obtained as a resultant was filtered with a 1 μm-sized TEFLON (tetrafluoroethylene) filter under the dry nitrogen atmosphere. Subsequently, 1,000 g of dry xylene was added to 1,000 g of the filtered solution, a rotary evaporator was used to three times repetitively substitute the solvent from pyridine to xylene and adjust its solid concentration into 20 wt %, and the resultant was filtered with a TEFLON (tetrafluoroethylene) filter having a pore size of 0.03 μm, obtaining perhydropolysiloxazane.

The weight average molecular weight of the perhydropolysiloxzan was 3,500.

In addition, the perhydropolysiloxazane was coated on a patterned substrate with a spin coater, dried on a 100° C. hot plate, and heated at 750° C., water under an oxygen atmosphere including a partial vapor pressure of 5 kPa for 1 hour.

The thickness shrinkage rate of the film before and after the heating was 16.9%, and N/Si of the film was 0.97.

Example 1

A 1 L reactor equipped with an agitator and a thermometer was internally substituted with dry nitrogen. Then, 100 g of a di-n-butylether solution including 20 wt % of the hydrogenated polysiloxazane according to Comparative Example 1, 2.0 g of cyclopentasilane, and 300 g of dry pyridine were injected into the reactor, and the reactor was internally substituted with dry nitrogen. The reactor was slowly heated in an oil bath, maintained at 100° C. for 5 hours, and cooled down to room temperature. Then, a rotary evaporator was used to add 1,000 g of dry di-n-butylether to the reactor to substitute di-n-butylether for the pyridine in the solvent and simultaneously adjust a solid concentration into 20 wt %, and a TEFLON (tetrafluoroethylene) filter having a pore size of 0.03 μm was used to filter the resultant, obtaining a modified hydrogenated polysiloxazane solution.

The polystyrene-converted weight average molecular weight of the modified hydrogenated polysiloxazane solution was 3,500, and N/Si of the modified hydrogenated polysiloxazane solution was 0.93.

In addition, the modified hydrogenated polysiloxazane solution was spin-coated on a silicon wafer at a speed of 1,500 rpm for 20 seconds, dried on a 100° C. hot plate for 5 minutes, and heated at 750° C. under an oxygen atmosphere including a partial water vapor pressure of 5 kPa for one hour.

The film thickness shrinkage rate before and after the heating was 15.7%.

Example 2

A 1 L reactor equipped with an agitator and a thermometer was internally substituted with dry nitrogen. Then, 100 g of a di-n-butylether solution including 20 wt % of hydrogenated polysiloxazane according to Comparative Example 1, 4.0 g of cyclopentasilane, and 300 g of dry pyridine were injected in the reactor, and the reactor was internally substituted with dry nitrogen. The reactor was slowly heated in an oil bath, maintained at 100° C. for 5 hours, and cooled down to room temperature. Then, 1,000 g of dry di-n-butylether was added to the reactor by using a rotary evaporator to substitute di-n-butylether for pyridine in the solvent and simultaneously, adjust a solid concentration into 20%, and the resultant was filtered with a TEFLON (tetrafluoroethylene) filter having a pore size of 0.03 μm, obtaining a modified hydrogenated polysiloxazane solution.

The polystyrene-reduced weight average molecular weight of the modified hydrogenated polysiloxazane solution was 3,500, and N/Si of modified hydrogenated polysiloxazane solution was 0.92.

In addition, the modified hydrogenated polysiloxazane solution was spin-coated on a silicon wafer at a speed of 1,500 rpm for 20 seconds, dried on a 100° C. hot plate for 5 minutes, and heated at 750° C. under an oxygen atmosphere including a partial water vapor pressure of 5 kPa for one hour.

A film thickness shrinkage rate before and after the heating was 14.4%.

Example 3

A 1 L reactor equipped with an agitator and a thermometer was internally substituted with dry nitrogen. Then, 100 g of a di-n-butylether solution including 20 wt % of the hydrogenated polysiloxazane according to Comparative Example 1, 6.0 g of cyclopentasilane, and 300 g of dry pyridine were injected into the reactor, and the reactor was internally substituted with dry nitrogen. The reactor was slowly heated in an oil bath, maintained at 100° C. for 5 hours, and cooled down to room temperature. Then, 1,000 g of dry di-n-butylether was added by using a rotary evaporator to substitute di-n-butylether for pyridine in the solvent and simultaneously, adjust a solid concentration into 20%, and the resultant was filtered with a TEFLON (tetrafluoroethylene) filter having a pore size of 0.03 μm, obtaining a modified hydrogenated polysiloxazane solution.

The polystyrene-reduced weight average molecular weight of the modified hydrogenated polysiloxazane solution was 3,500, and N/Si of the modified hydrogenated polysiloxazane solution was 0.91.

In addition, the modified hydrogenated polysiloxazane solution was spin-coated at a speed of 1,500 rpm for 20 seconds on a silicon wafer, dried on a 100° C. hot plate for 5 minutes and heated at 500° C. under an oxygen atmosphere including a partial water vapor pressure of 5 kPa for 5 minutes for one hour.

A film thickness shrinkage rate before and after the heating was 13.8%.

Compared with Comparative Example 2, the modified polysiloxazane films according to Examples 1, 2, and 3 showed a decreased thickness shrinkage rate relative to the polysiloxazane film having an equivalent weight average molecular weight.

The films according to Example and Comparative Example were evaluated by using the following apparatuses.

Weight average molecular weight:
GPC made by Waters Inc.; HPLC Pump 1515, RI Detector 2414
Column made by Shodex; KF801, KF802, KF803
Modification by a standard polystyrene polymer
N/Si: XPS; JPS-9010 (JEOL Ltd.)
Film thickness shrinkage rate: a shrinkage rate was calculated according to the following equation 1 after measuring a film thickness before and after heating (before heating: T1, after heating: T2) under a water vapor atmosphere by using a reflection spectroscopic film thickness measuring device (ST-4000, K-MAC Corp.)

$$(T1-T2)/T1 \times 100 (\%) \qquad \text{[Equation 1]}$$

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A modified hydrogenated polysiloxazane prepared by reacting a hydrogenated polysiloxazane with a silane compound selected from a polysilane, a polycyclosilane, and a silane oligomer, wherein the modified hydrogenated polysiloxazane has an oxygen content of 0.2 to 3 wt %, based on a total weight of the modified hydrogenated polysiloxazane.

2. The modified hydrogenated polysiloxazane of claim 1, wherein the modified hydrogenated polysiloxazane has an atom number ratio (N/Si) of a nitrogen atom relative to a silicon atom of less than or equal to 0.95.

3. The modified hydrogenated polysiloxazane of claim 1, wherein the modified hydrogenated polysiloxazane includes structural units represented by the following Chemical Formulae 1 to 3:

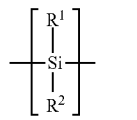

[Chemical Formula 1]

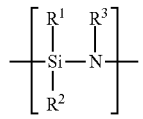

[Chemical Formula 2]

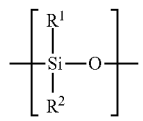

[Chemical Formula 3]

wherein, in the above Chemical Formulae 1 to 3, $R^1$ and $R^2$ are each independently selected from H, $SiH_3$, and $NH_2$, and $R^3$ is H or $SiH_3$.

4. The modified hydrogenated polysiloxazane of claim 1, wherein the modified hydrogenated polysiloxazane has a weight average molecular weight of 1,000 to 30,000.

5. A composition for forming a silica-based insulation layer comprising the modified hydrogenated polysiloxazane as claimed in claim 1.

6. The composition for forming a silica-based insulation layer of claim 5, wherein the modified hydrogenated polysiloxazane has an atom number ratio (N/Si) of a nitrogen atom relative to a silicon atom of less than or equal to 0.95.

7. The composition for forming a silica-based insulation layer of claim 5, wherein the modified hydrogenated polysiloxazane includes structural units represented by the following Chemical Formulae 1 to 3:

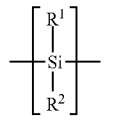

[Chemical Formula 1]

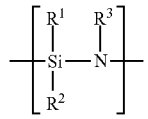

[Chemical Formula 2]

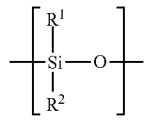

[Chemical Formula 3]

wherein, in the above Chemical Formulae 1 to 3, $R^1$ and $R^2$ are each independently selected from H, $SiH_3$, and $NH_2$, and $R^3$ is H or $SiH_3$.

8. The composition for forming a silica-based insulation layer of claim 5, wherein the modified hydrogenated polysiloxazane has a weight average molecular weight ranging from 1000 to 30000.

9. The composition for forming a silica-based insulation layer of claim 5, wherein the modified hydrogenated polysiloxazane is included in an amount of 0.1 to 50 wt % based on the composition.

10. A method of preparing a composition for forming a silica-based insulation layer, the method comprising
reacting a hydrogenated polysiloxazane with a silane compound in a solvent while heating, or adding a halosilane compound and a silane compound to a mixture of pyridine and water and performing coammonolysis, to synthesize a modified hydrogenated polysiloxazane in a solution,
wherein the silane compound is selected from a polysilane, a polycyclosilane, and a silane oligomer.

11. The method of claim 10, wherein:
the modified hydrogenated polysiloxazane is synthesized by performing the coammonolysis, and
the halosilane compound is selected from dichlorosilane, trichlorosilane, tetrachlorosilane, and a mixture thereof.

12. The method of claim 10, wherein the silane compound has a structure represented by the following Chemical Formula 4:

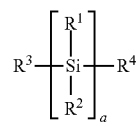

[Chemical Formula 4]

wherein, in the above Chemical Formula 4,
$R^1$ and $R^2$ are each independently selected from H, $SiH_3$, $NH_2$, Cl, Br, and I,
$R^3$ and $R^4$ are each independently selected from H, $SiH_3$, $NH_2$, Cl, Br, and I, or are fused to each other to provide a ring, and
a is an integer ranging from 1 to 30.

13. The method of claim 10, wherein:
the modified hydrogenated polysiloxazane is synthesized by performing the coammonolysis, and
the silane compound is cyclopentasilane.

14. The method of claim 10, further comprising substituting a solvent of the solution with a nonpolar solvent.

15. The method of claim 14, wherein the nonpolar solvent is xylene or n-butylether.

16. A composition for forming a silica-based insulation layer prepared according to the method as claimed in claim 10.

17. A silica-based insulation layer manufactured using the composition for forming a silica-based insulation layer as claimed in claim 16.

18. A silica-based insulation layer manufactured using a composition for forming a silica-based insulation layer, the composition for forming a silica-based insulation layer including a modified hydrogenated polysiloxazane, the modified hydrogenated polysiloxazane being prepared by reacting a hydrogenated polysiloxazane with a silane compound selected from a polysilane, a polycyclosilane, and a silane oligomer.

19. A method of manufacturing a silica-based insulation layer, the method comprising:
applying the composition for forming a silica-based insulation layer according to claim 6 on a substrate;

soft-baking the substrate applied with the composition for forming a silica-based insulation layer at a temperature of greater than or equal to 50° C. and less than or equal to 200° C.; and heating the soft-baked substrate at a temperature of greater than or equal to 200° C. and less than or equal to 1,000° C., under an oxygen atmosphere or a standard pressure atmosphere including water vapor having a partial pressure of greater than or equal to 0.1 kPa.

* * * * *

UNITED STATES PATENT AND TRADEMARK OFFICE
CERTIFICATE OF CORRECTION

PATENT NO. : 9,890,255 B2  
APPLICATION NO. : 14/429512  
DATED : February 13, 2018  
INVENTOR(S) : Hyun-Ji Song et al.

Page 1 of 1

It is certified that error appears in the above-identified patent and that said Letters Patent is hereby corrected as shown below:

On the Title Page

Item (54) Title should read:
MODIFIED HYDROGENATED POLYSILOXAZANE, COMPOSITION COMPRISING SAME FOR FORMING SILICA-BASED INSULATION LAYER, METHOD FOR PREPARING COMPOSITION FOR FORMING SILICA-BASED INSULATION LAYER, SILICA-BASED INSULATION LAYER, AND METHOD FOR PREPARING SILICA-BASED INSULATION LAYER Signed and Sealed this
Twenty-eighth Day of May, 2019

Andrei Iancu
*Director of the United States Patent and Trademark Office*